United States Patent
Huang et al.

(10) Patent No.: US 11,764,104 B2
(45) Date of Patent: Sep. 19, 2023

(54) FORMING AN OXIDE VOLUME WITHIN A FIN

(71) Applicant: Intel Corporation, Santa Clara, CA (US)

(72) Inventors: Cheng-Ying Huang, Portland, OR (US); Gilbert Dewey, Beaverton, OR (US); Jack T. Kavalieros, Portland, OR (US); Aaron Lilak, Beaverton, OR (US); Ehren Mannebach, Beaverton, OR (US); Patrick Morrow, Portland, OR (US); Anh Phan, Beaverton, OR (US); Willy Rachmady, Beaverton, OR (US); Hui Jae Yoo, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 921 days.

(21) Appl. No.: 16/454,553

(22) Filed: Jun. 27, 2019

(65) Prior Publication Data
US 2020/0411365 A1   Dec. 31, 2020

(51) Int. Cl.
| | |
|---|---|
| *H01L 27/12* | (2006.01) |
| *H01L 21/762* | (2006.01) |
| *H01L 21/02* | (2006.01) |
| *H01L 21/225* | (2006.01) |
| *H01L 21/265* | (2006.01) |
| *H01L 21/266* | (2006.01) |

(Continued)

(52) U.S. Cl.
CPC .. *H01L 21/76264* (2013.01); *H01L 21/02236* (2013.01); *H01L 21/02252* (2013.01); *H01L 21/02255* (2013.01); *H01L 21/2253* (2013.01); *H01L 21/2255* (2013.01); *H01L 21/266* (2013.01); *H01L 21/26533* (2013.01); *H01L 21/31111* (2013.01); *H01L 21/76267* (2013.01); *H01L 29/0649* (2013.01); *H01L 29/7853* (2013.01)

(58) Field of Classification Search
CPC ............... H01L 27/1211; H01L 27/0886
See application file for complete search history.

(56) References Cited

U.S. PATENT DOCUMENTS

| | | |
|---|---|---|
| 9,224,738 B1 | 12/2015 | Zanderigo et al. |
| 2009/0278196 A1 | 11/2009 | Chang |

(Continued)

OTHER PUBLICATIONS

Search Report from European Patent Application No. 20165817.6, dated Sep. 9, 2020, 8 pgs.

(Continued)

*Primary Examiner* — Jae Lee
(74) *Attorney, Agent, or Firm* — Schwabe, Williamson & Wyatt P.C.

(57) ABSTRACT

Embodiments of the present disclosure may generally relate to systems, apparatus, and/or processes to form volumes of oxide within a fin, such as a Si fin. In embodiments, this may be accomplished by applying a catalytic oxidant material on a side of a fin and then annealing to form a volume of oxide. In embodiments, this may be accomplished by using a plasma implant technique or a beam-line implant technique to introduce oxygen ions into an area of the fin and then annealing to form a volume of oxide. Processes described here may be used manufacture a transistor, a stacked transistor, or a three-dimensional (3-D) monolithic stacked transistor.

8 Claims, 13 Drawing Sheets

(51) Int. Cl.
*H01L 21/311* (2006.01)
*H01L 29/06* (2006.01)
*H01L 29/78* (2006.01)

(56) References Cited

U.S. PATENT DOCUMENTS

| | | |
|---|---|---|
| 2010/0144121 A1 | 6/2010 | Chang |
| 2015/0194426 A1* | 7/2015 | Liu .................... H01L 27/0886 |
| | | 438/283 |
| 2015/0228668 A1* | 8/2015 | Ponoth ............... H01L 27/1207 |
| | | 257/350 |
| 2016/0336235 A1 | 11/2016 | Cheng |
| 2018/0076202 A1* | 3/2018 | Basker ................ H01L 29/161 |
| 2018/0108732 A1* | 4/2018 | Shu .................... H01L 29/7851 |
| 2018/0151702 A1* | 5/2018 | Kim ................... H01L 29/1037 |
| 2018/0247939 A1 | 8/2018 | Glass |
| 2020/0343338 A1* | 10/2020 | Joseph ............... H01L 21/8221 |

OTHER PUBLICATIONS

Office Action from European Patent Application No. 20165817.6, dated Jun. 30, 2022, 8 pgs.

\* cited by examiner

FORMING AN OXIDE VOLUME WITHIN A FIN

FIELD

Embodiments of the present disclosure generally relate to the field of transistors, and in particular manufacturing transistors with stacked channels.

BACKGROUND

Continued reduction in end product size of mobile electronic devices, such as smart phones and ultrabooks, is a driving force for the development of increased density and performance of transistors.

DETAILED DESCRIPTION

Figure 1B:
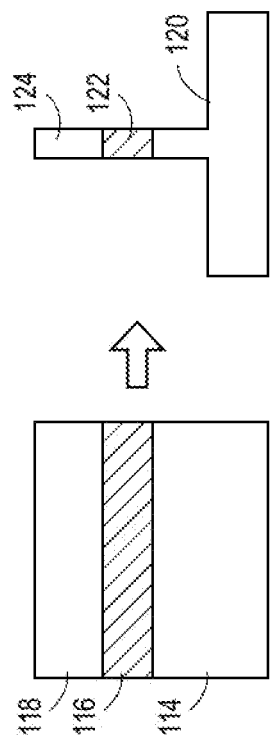
FIGS. 1A-1B illustrate an example of legacy implementations of inserting an oxide layer between a top silicon (Si) channel and a bottom Si channel.

Embodiments of the present disclosure may generally relate to systems, apparatus, techniques and/or processes that may be used to form volumes of oxide within a fin, such as a Si fin, that may be used to manufacture a transistor, a stacked transistor, or a three-dimensional (3-D) monolithic stacked transistor. Embodiments may include a fin with a first side and a second side opposite the first side that are substantially parallel to a plane of the fin. One or more volumes of oxide extend through the fin from a first area on the first side of the fin to a second area on the second side of the fin, where oxide is formed based at least in part on fin material previously present in the one or more volumes.

In embodiments, processes or techniques may include forming a fin that has a first side and a second side opposite the first side, depositing a catalytic oxidant material on a first area on the first side of the fin and on a second area on the second side of the fin, and annealing the deposited catalytic oxidant material to form an oxide in at least a portion of a volume of the fin between the first area on the first side of the fin and the second area on the second side of the fin.

In embodiments, processes or techniques may include forming a fin, applying a protective material to a first portion of the fin, applying a plasma implant process or a beam-line implant process to a second portion of the fin to deposit oxygen ions into a third portion of the fin, wherein the protective material is to prevent material in the fin proximate to the protective material from receiving oxygen ions, and annealing at least the third portion of the fin to form a volume of oxide in the third portion of the fin.

In embodiments, the various components of the process may be performed at different times during the manufacturing of a transistor or other device. For example, applying a catalytic oxidant material to a portion of one or more fins, or applying a plasma implant process or a beam-line implant process to a portion of one or more fins may be done at a first time during an initial assembly a stacked transistor, with the annealing process implemented at a subsequent time in the manufacturing process to form the various oxide layers within the stacked transistor or device.

Increasing the density and the performance of multiple transistors will aid in the creation of higher performing devices that have a smaller overall footprint. Continuing to scale transistors in a lateral direction may become more complicated and introduce lithography and other challenges that may be avoided by scaling transistors in a vertical dimension. Monolithic 3-D stacked transistors are a potential path to further extend Moore's law beyond 5 nanometer (nm) generations of devices. By stacking transistors, or channels, directly on top of each other, 3-D complementary metal oxide semiconductor (CMOS) architecture may enable a smaller cell size, higher transistor density, and lower resistive-capacitive (RC) delay compared with conventional two-dimensional (2-D) CMOS. To scale multiple devices in vertical direction, separate semiconductor layers are stacked, with electrical insulation between the layers so that, for example, N-channel metal oxide semiconductor field effect transistor (NMOS) and P-channel metal oxide semiconductor field effect transistor (PMOS) layers are not electrically shorted.

Legacy implementations, for example a shared-gate self-aligned stacked transistor architecture approach, may include using a Si diffusion pattern to define a Si fin or ribbons which are the electrical conducting channels. A poly patterning is used to define a replacement poly gate, where the diffusions and poly are perpendicular to each other. This legacy implementation can be defined in a single lithography step, and then top and bottom channels can be separately manufactured to make stacked channel transistors. For example, the top Si channel and bottom Si channel are separated by a sacrificial silicon germanium (SiGe) layer. The SiGe layer can be selectively removed in the downstream flow to separate top and bottom channels. In another legacy approach, the top and bottom channel can be separated by a bonding oxide if the stacked transistors are made on a silicon on insulator (SOI) wafer.

Embodiments described herein may be directed to processes to make stacked channels in a transistor using local oxidation to create an oxide layer, which may be referred to as a localized oxide, between the channels. By forming a localized oxide in between the stacked channels, the top channels and bottom channels can be electrically separated. The localized oxide also may reduce the parasitic capacitance in the stacked transistor due to a reduced area of gate-drain overlap. These processes and techniques may also be more economical than legacy implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

Various figures herein may depict one or more layers of one or more package or device assemblies. The layers depicted herein are depicted as examples of relative positions of the layers of the different package assemblies. The layers are depicted for the purposes of explanation, and are not drawn to scale. Therefore, comparative sizes of layers should not be assumed from the figures, and sizes, thicknesses, or dimensions may be assumed for some embodiments only where specifically indicated or discussed.

Figure 1A:
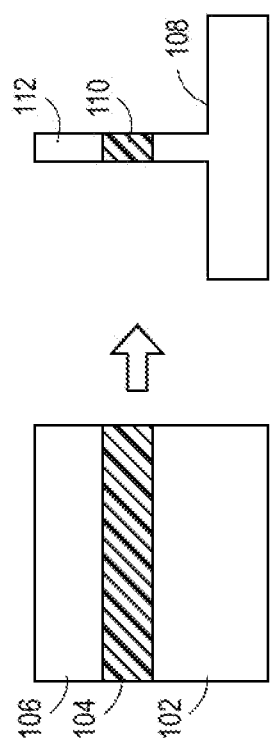

FIGS. 1A-1B illustrate an example of legacy implementations of inserting an oxide layer between a top Si channel and a bottom Si channel. FIG. 1A shows a legacy implementation of a top channel 106, 112 of silicon and a bottom channel 102, 108 of silicon that is separated by a SiGe layer 104, 110 that is epitaxially grown. Because Si and SiGe have different lattice constants, the resulting epitaxial layer may form defects once a strain energy exceeds a critical threshold. For example, once the thickness of the SiGe layer 104, 110 is over a critical thickness threshold value, the SiGe layer 104, 110 may begin to relax and to create defects in the structure. This behavior imposes a maximum thickness of the stacked channels. In other embodiments, the top channel 106, 112 and bottom channel 102, 108 may be SiGe that is separated by a Si layer 104, 110, and may experience similar defect problems as described above.

FIG. 1B shows a legacy implementation of a stacked channel fabricated on a SOI wafer. The top channel 118, 124 and the bottom channel 114, 120 may be made of Si, with a bonding oxide (BOX) layer 116, 122 separating the two channels. The BOX thickness determines a separation distance between the top channel 118, 124 and the bottom channel 114, 120. In implementations, the BOX performs a similar function to a glue, where two different wafers are attached to each other using oxide-oxide bonding technique. The disadvantage of this approach is that fabricating a stacked transistor using SOI wafer bonding increases the cost due to the expense of SOI wafers.

Figure 2A:
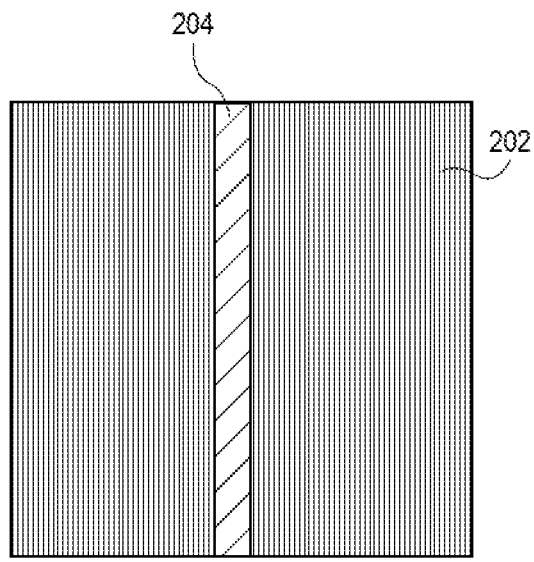
FIGS. 2A-2L illustrate an example of a device assembly at various stages using a catalytic oxide technique to insert an oxide within a fin to separate a top channel from a bottom channel in the fin, in accordance with embodiments.
Figure 2B:
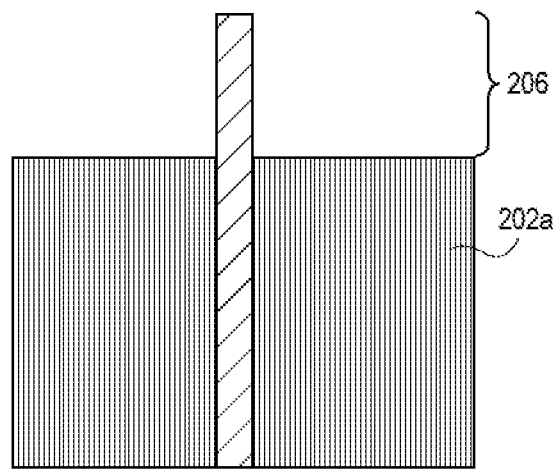

FIGS. 2A-2L illustrate an example of a device assembly at various stages using a catalytic oxide technique to insert an oxide within a fin to separate a top channel from a bottom channel in the fin, in accordance with embodiments. FIG. 2A shows a fin 204 that is embedded within a trench material 202, which may also be referred to as a trench fill. In embodiments, the fin 204 may be made of Si, SiGe, or Ge. In embodiments, the fin 204 may be made of III-V materials such as indium gallium arsenide (InGaAs) or indium phosphide (InP). The fin 204 may be orthogonal to a substrate (not shown), and may also be referred to as a vertical pillar or elongated pillar. In embodiments, the trench material 202 may be an oxide or an oxynitride. The trench material 202 may form or be a portion of a shallow trench isolation (STI) substrate. FIG. 2B shows a portion of the trench material 202 etched away to form 202a, exposing a fin portion 206. In embodiments, the etching may be performed with a selective etch or dry etch. In embodiments, the height of the exposed fin 206 may be on the order of 60 nm.

Figure 2C:
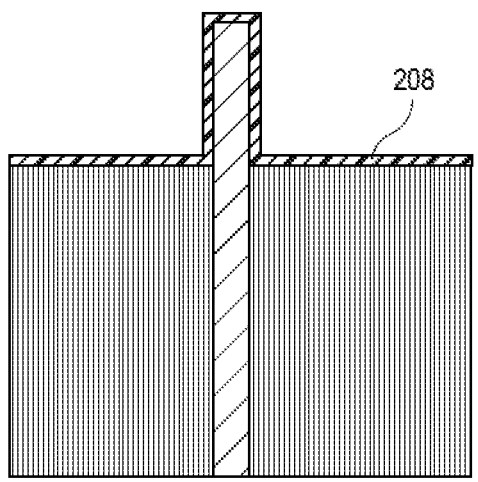
Figure 2D:
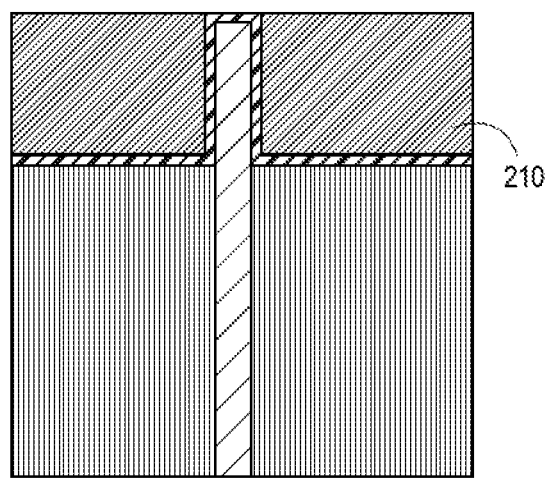
Figure 2E:
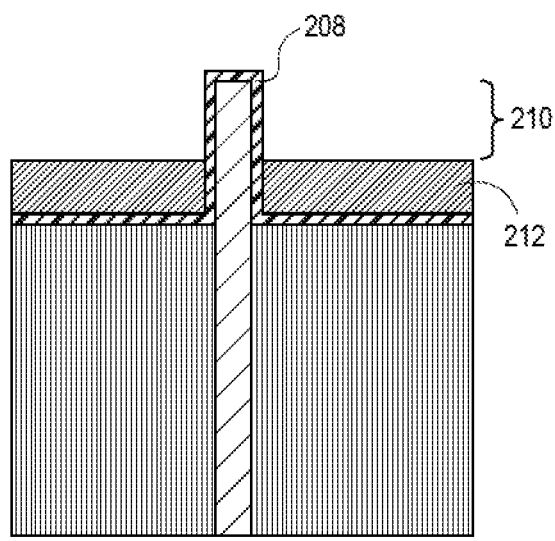
Figure 2F:
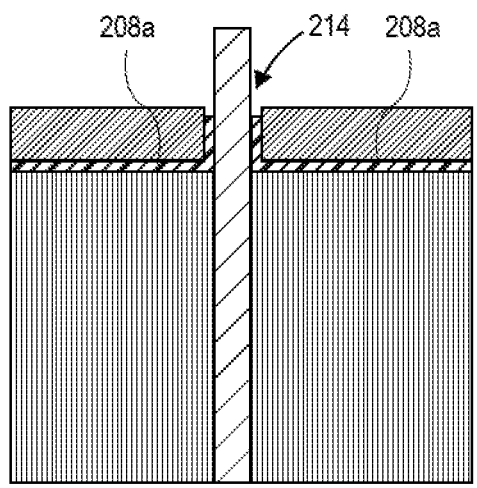
Figure 2G:
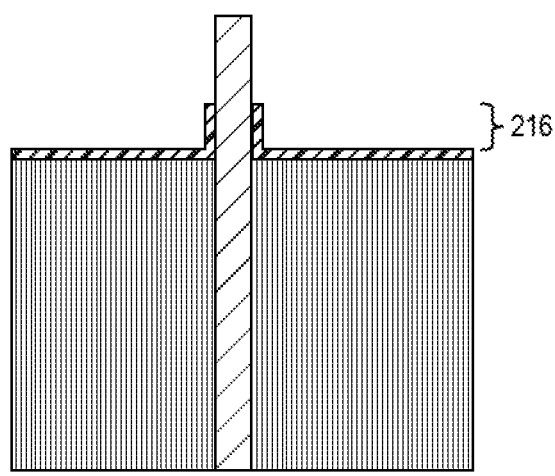

At FIG. 2C, a catalytic oxidant material 208 is applied to a surface of the trench material 202a and to the surface of the exposed fin 206. In embodiments, the catalytic oxidation material may be alumina-based. Catalytic oxidation materials may include aluminum oxide ($Al_2O_3$), aluminum nitride (AlN), tungsten trioxide ($WO_3$), molybdenum trioxide ($MoO_3$), titanium dioxide ($TiO_2$), or alkali metals including lithium (Li), sodium (Na), potassium (K), rubidium (Rb), cesium (Cs), ruthenium (Ru), palladium (Pd), or silicates. In embodiments, a deposited oxygen-rich film or deposited oxide may be used based upon the relative affinity for oxygen between the film and the surface of the exposed fin 206. At FIG. 2D, a gap fill material 210 is placed on top of the catalytic oxidant material 208, and planarized. In embodiments, the gap fill material 210 may be a carbon hard mask (CHM), a reflow oxide, or oxynitride. At FIG. 2E, the planarized gap fill material 210 may be recessed creating gap fill material 212, exposing a fin portion 210 that is covered with the catalytic oxidant material 208. At FIG. 2F, a wet etch of the catalytic oxidant 208 may be removed 214 to leave a residual catalytic oxidant layer 208a. At FIG. 2G, the remaining gap fill material 212 may be removed, leaving a fin layer 216 that is coated with the catalytic oxidant 208.

Figure 2H:
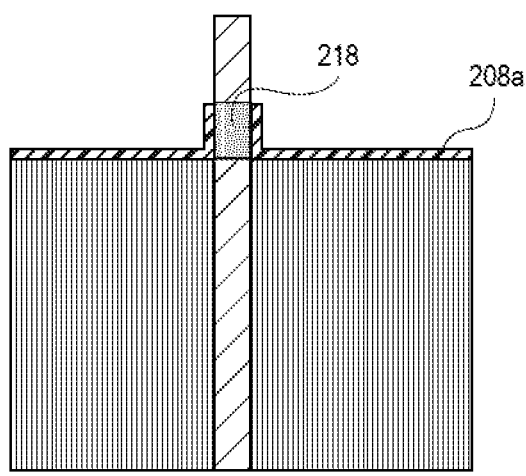

At FIG. 2H, an annealing process is performed to form an oxide 218 within the fin 204. In embodiments, the annealing process may be a thermal process performed in a diffusion furnace, using a rapid thermal anneal (RTA) tool, or using a laser anneal. For catalytic oxidants that are alumina-based, the annealing process may involve heating to 600° C. for a few minutes to catalyze the oxide 218 in the fin. In embodiments, the temperature may be increased or decreased depending upon the amount of time in the annealing process.

Other catalytic oxidation materials may include $Al_2O_3$, AlN, $WO_3$, $MoO_3$, $TiO_2$, or alkali metals including Li, Na, K, Rb, Cs, Ru, Pd, or silicates. With the presence of catalytic oxide 208a coupled directly with the fin 204, the Si oxidation rate at the coupling is significantly faster than other portions of the fin. This enables a localized oxidation process that forms oxide 218.

Figure 2I:
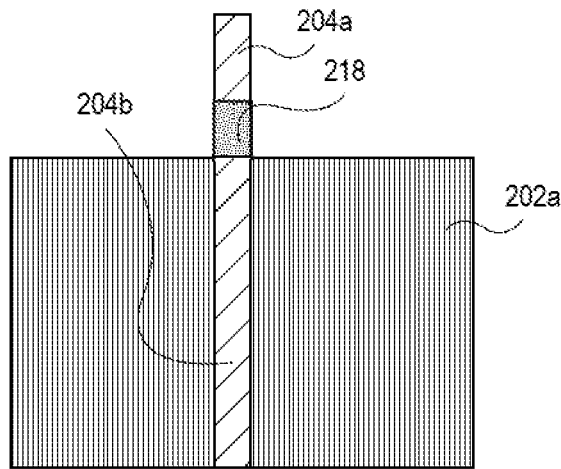

At FIG. 2I, the catalytic oxide 208a is removed. In embodiments, a wet etch or some other etch process may be used. This creates a localized oxide 218 in the Si sub fin region. As shown, as a result of this local oxidation, a Si CMOS no longer needs well implants to perform device-substrate isolation, for example, between sub fins 204a and 204b, are now isolated by oxide 218. In legacy implementations, sub fin regions have counter doping opposite the source/drain. This is referred to as a well implant and is used to reduce sub-fin electrical leakage. It also provides device isolation to the substrate. Techniques shown in FIG. 2I may potentially increase channel mobility and reduce dopant variation and the need for well doping. In legacy techniques, implants may cause transistor voltage (Vt) variation due to random doping fluctuation. The dopant in the Si channel also degrades carrier mobility. With embodiments using a localized oxide like 218, no dopant is needed in the Si fin. Also, the oxide 218 may act as an insulator and cut off an electrical leakage path at the sub fin regions (any Si materials below the active Si fins). This may prevent sub fin leakage and improve electrostatics control on the channel.

Figure 2J:
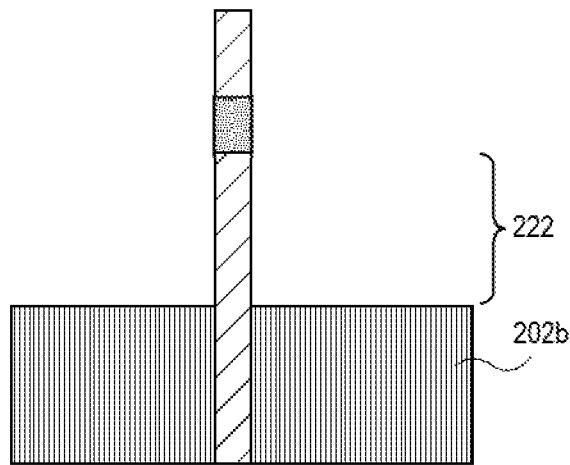
Figure 2K:
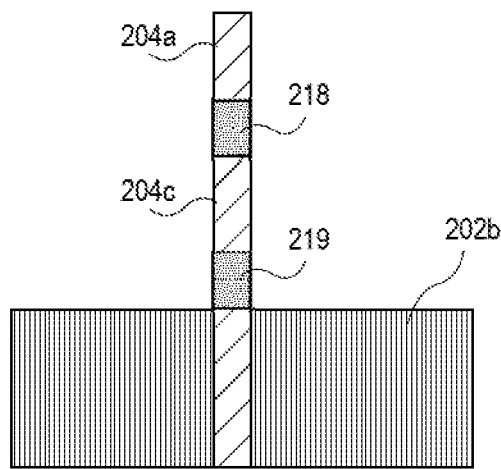

At FIG. 2J, a second recess of trench material 202a may be performed using one or more of the processes described above. This results in additionally recessed trench material 202b and in a newly exposed fin area 222. FIG. 2K shows, by continuing the local oxidation process, a fin-on-fin structure may be created. After creating the oxide 218 after the first local oxidation, the catalytic oxidation process can be implemented again using one or more of the processes described above. As a result, for example, a fin (204a)-oxide (218)-fin (204c)-oxide (219) structure can be made.

Figure 2L:
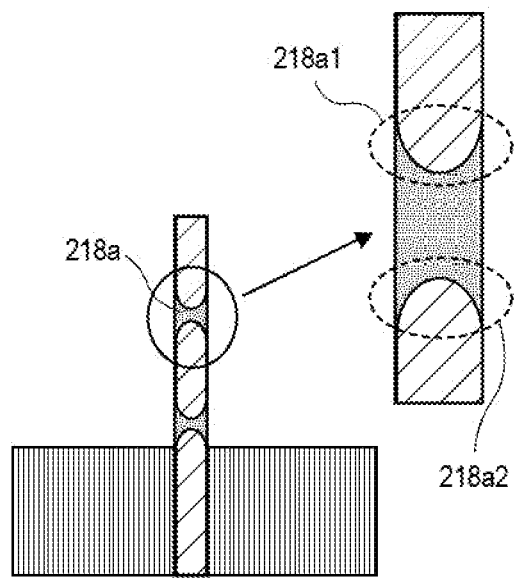

FIG. 2L shows an example of possible characteristics of an oxide 218a formed using local oxidation techniques as described above. In embodiments, the local oxidation techniques may work for fins 204 with a thickness of at least up to 20 to 30 nm. In embodiments, actual thickness dimensions of fins 204 maybe 5 to 10 nm, or less. For fins 204 of less thickness, for example less than 10 nm, the edges of the oxide 218 between an upper fin 204a, and a lower fin 204c may be substantially planar and perpendicular to the plane of the fin 204 as shown in FIG. 2K. However, for fins 204 of the greater thickness, for example greater than 10 nm, the edges 218a1, 218a2, of the oxide 218a may appear rounded, teardrop shaped, as an elliptic hyperboloid, having a taper, or having a non-planar shape.

FIGS. 3A-3D illustrate an example of a device assembly at various stages using oxygen implant techniques to insert an oxide within a fin to separate a top channel from a bottom channel in the fin, in accordance with embodiments. In embodiments, FIGS. 3A-3D show techniques to implant oxygen to form a sub fin oxide.

Figure 3A:
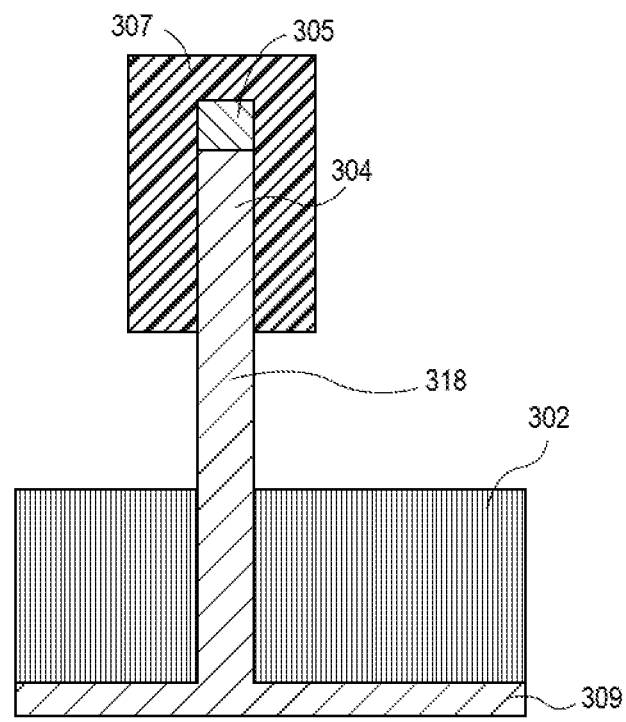
FIGS. 3A-3D illustrate an example of a device assembly at various stages using oxygen implant techniques to insert an oxide within a fin to separate a top channel from a bottom channel in the fin, in accordance with embodiments.

FIG. 3A shows a fin 304 that is coupled with a trench material 302. In embodiments, the trench material 302 be similar to trench material 202 and fin 304 is similar to fin 204 of FIG. 2A. The fin 304 may be covered by a helmet 307 that includes protective material to provide a protective cover for at least a portion of the fin 304. The trench material 302 may also provide a protective cover to a portion of the fin 304 coupled with the trench material 302. In embodiments, the fin 304 may couple with a wafer layer 309 that is substantially perpendicular to the fin 304. In embodiments, a remnant layer 305 that is coupled with the fin 304 may protect the top of the fin 304. The remnant layer 305 may be a semiconductor material or a non-semiconductor material such as a nitride, or poly silicon. In embodiments, a portion of the fin 304 not covered by the helmet 307 or the trench material 302 may be subject to a pre-amorphization implant (PAI) technique to implant Si or Ge to amorphize the Si. This may cause oxygen implant area 318 to become amorphous Si.

Figure 3B:
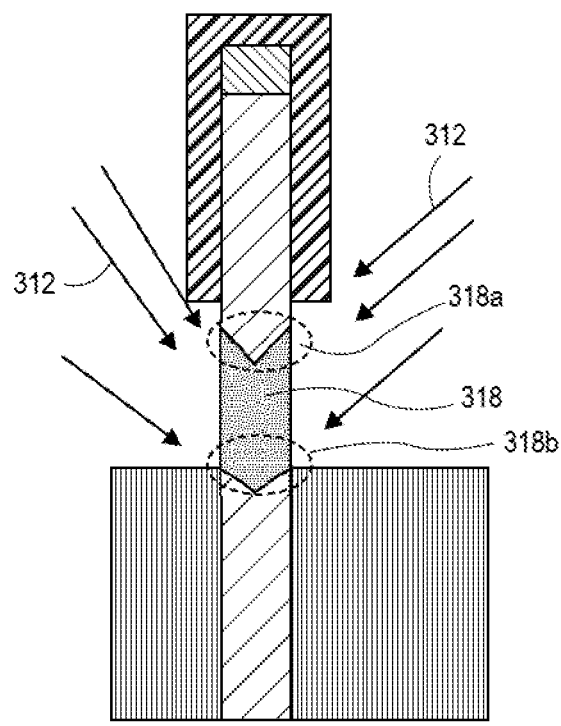

At FIG. 3B, oxygen is implanted using a beam-line implant technique. The beams 312 may be generated from a beam-line ion implanter that ionizes, accelerates, and shoots oxygen from an ion gun (not shown). In embodiments, the ion gun will produce a narrow beam 312 that is rasterized across the oxygen implant area 318. The beams 312 may be directed at a specific tilt angle, and that angle may be the same angle used throughout the beam-line implant process. In embodiments, multiple ion guns (not shown) may be used, for example, one from one side of the fin 304 and one from the opposite side. The energy of the oxygen implant from the ion gun will remain inside the oxygen implant area 318. The energy used should not exceed the energy required to penetrate the helmet 307, the fin 304, or the trench material 302. In embodiments, this energy may be less than 5 kV. Sufficient oxygen should be implanted to form silicon dioxide ($SiO_2$) within the oxygen implant region 318.

Subsequently, the oxygen implant area 318 is subjected to an annealing process to convert the oxygen implant area 318 to an oxide layer 318. Note, as a result of the beam 312 angles, the ends of the oxide layer 318a, 318b may be at an angle corresponding to the beam 312 angles. In embodiments, this technique may leave a slight but detectable residual in the non-oxidized fin 304 region proximate to the oxide layer 318. This residual may include oxygen species that may be detected with secondary ion mass spectrometry (SIMS) or atom probe measurement.

Figure 3C:
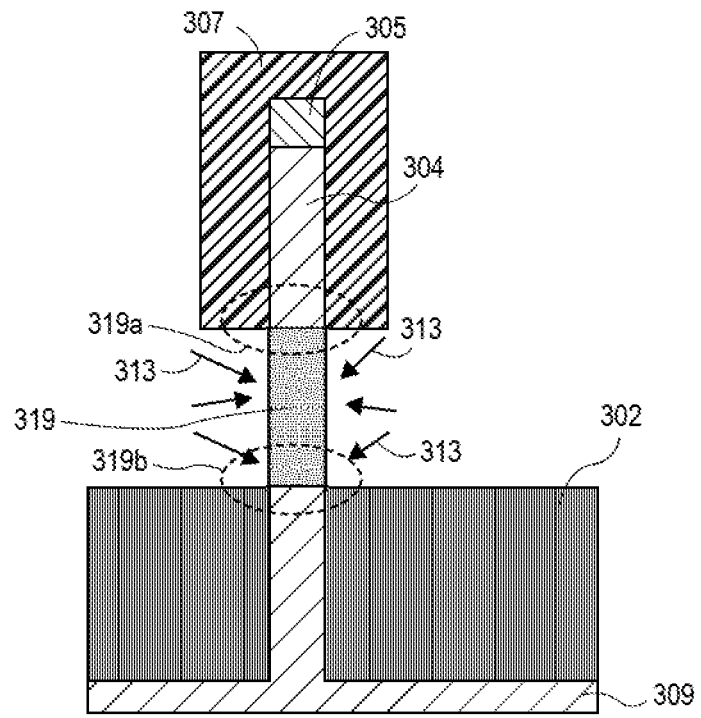

FIG. 3C shows oxygen implanted using a plasma implant technique. Unlike the beam-line implant technique described in FIG. 3B, the plasma implant technique does not need to have a line of exposure; instead, the exposed fin 319 will directly implant oxygen. In embodiments, the plasma contains oxygen species that may be a pulsed or be a DC-biased plasma. Bias then applied to the wafer layer 309 creates electrostatic force to pull ions 313 from the plasma into the oxygenated area 319. The oxygenated area 319 may then be subject to an annealing process, after which the oxygenated area 319 becomes an oxide layer 319.

Figure 3D:
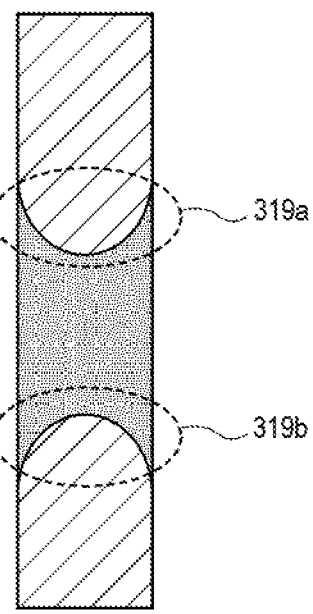

FIG. 3D shows an explosion of an embodiment of a first end 319a and a second end 319b of the oxide layer 319 of FIG. 3C. The ends 319a, 319b may appear rounded, teardrop shaped, as an elliptic hyperboloid, having a taper, or having some other non-planar shape. This may be due to the absorption pattern of oxygen ions within the oxygenated area 319. In embodiments, areas of the fin 304 in contact with the oxide 319 that has been formed using this technique may include non-oxide species that include fluorine, carbon, and the like, and may be detected with SIMS or atom probe measurement.

Figure 4A:
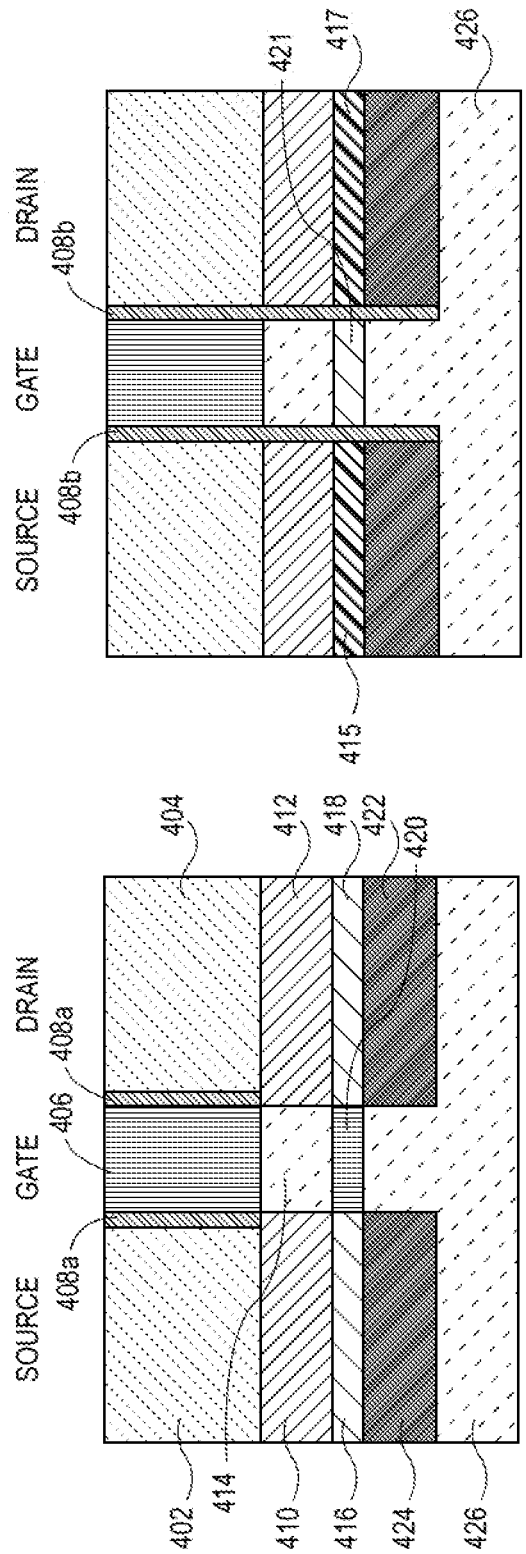
FIGS. 4A-4C illustrate examples of a device assembly using embodiments described herein to insert oxide layers and partial oxide layers within devices, in accordance with embodiments.
Figure 4B:
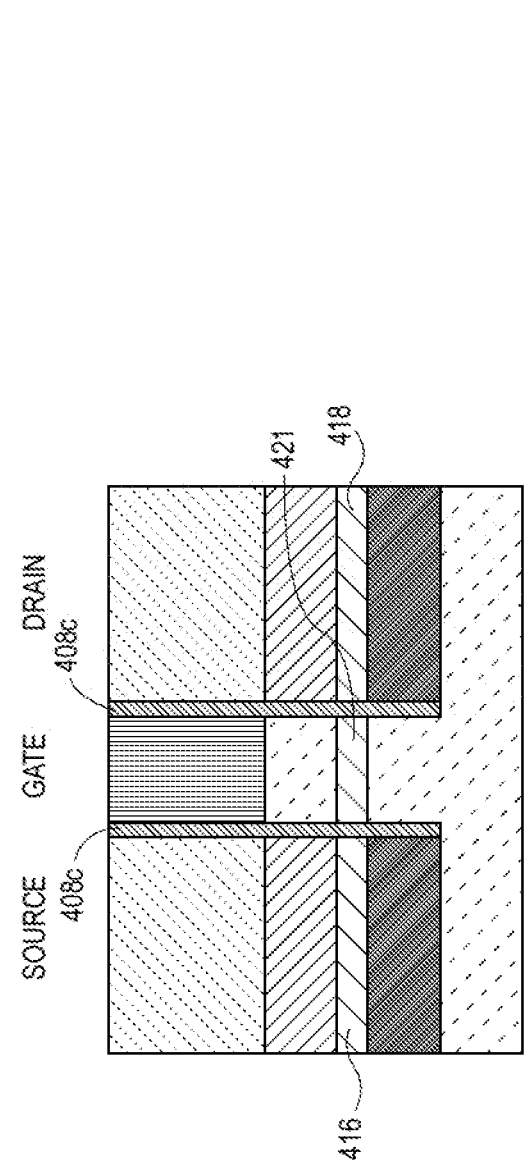
Figure 4C:
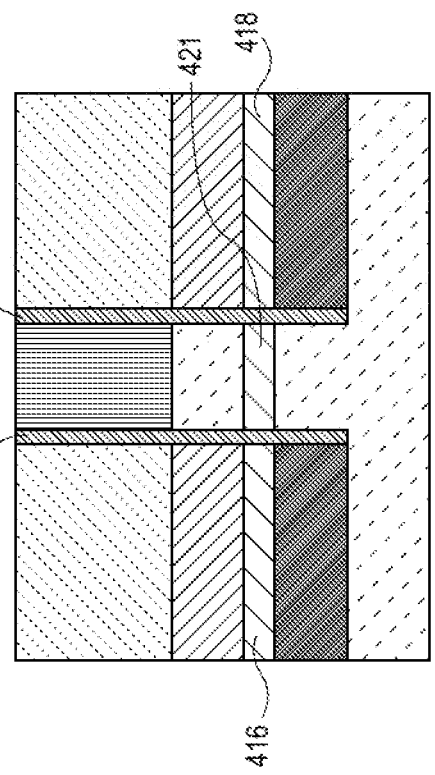

FIGS. 4A-4C illustrate examples of a device assembly using embodiments described herein to insert oxide layers and partial oxide layers within devices, in accordance with embodiments. These figures show examples of implementations of the local oxidation technique implemented at different locations on devices. Note that these figures may be simplified diagrams used to illustrate that local oxidation can take place at different locations of the process flow and may not represent final devices. For example, the device contacts, connection, and high-k gate dielectric are not shown for clarity.

FIG. 4A shows embodiments of local oxidation techniques described above implemented on a source/drain. The device shown is a stacked architecture of a two layer device. The device includes an inter-layer dielectric level 0 (ILD0) 402, 404, separated by a gate 406 surrounded by a gate spacer 408a, and gate 420. The device also includes an epitaxial Si layer 410, 412 doped with phosphorus, which may be noted as SI:P and forms an NMOS epitaxial layer, separated with silicon 414. The device also includes oxide layers 416, 418 coupled with the source and the drain, which may be formed using techniques described above. Below the oxide layers 416, 418, there is an epitaxial SiGe layer 424, 422 doped with boron, which may be noted as SiGe:B and forms a PMOS epitaxial layer and is separated with silicon 426. In embodiments, the silicon may extend as a layer 426 beneath the SiGe layer 424, 422.

FIG. 4B shows embodiments of the local oxidation techniques described above implemented on a gate. The device shown in FIG. 4B is similar to FIG. 4A, with a few differences. The gate 420 has been replaced by an oxide layer 421, which may be formed using techniques described above. In addition, the oxide layers 416, 418 have been replaced with insulator layers 415, 417. This embodiment shows the oxide formed only at the gate, which may be referred to as an oxidation at the gate trench.

FIG. 4C shows embodiments of the techniques described above implemented on both a source/drain and a gate. The device in FIG. 4C is similar to FIG. 4A, with a few differences. In particular, the portion of the gate 420 is now an oxide layer 421 that is in the same plane with oxide layers 416, 418. This embodiment shows the oxide formed at both the source, the drain, and the gate.

In other embodiments, FIGS. 4A-4C are shown with PMOS and NMOS configurations, however they may also be designed as NMOS and PMOS configurations, or both NMOS or both PMOS configurations. In embodiments, during manufacture of devices of the various embodiments, portions of the local oxidation techniques described above may be implemented at different times. For example, the resulting creation of an oxidation layer 416, 418, 421 may occur at a final stage of manufacture where the entire device is subject to an annealing process. The formation of localized oxide on a source/drain may be used to separate the epitaxial source/drain from top and bottom transistors. In embodiments, oxidation layers 416, 418 may be used to separate an epitaxial source/drain from top and bottom transistors (not shown). Oxidation layer 421 may be used to separate the top channel and a bottom channel of the device. Although these figures show a technique to create stacked transistor, other embodiments may apply this technique to create other devices.

Note that, with respect to the formation of localized oxide underneath channels, as described above, the localized oxide might induce strain and boost carrier mobility.

FIGS. 5A-5D illustrate examples and cross-sections of a device assembly using embodiments described herein to insert oxide layers and partial oxide layers within devices, in accordance with embodiments. The local oxidation techniques described herein may be applied to a unipolar stacked device architecture or a locally-unipolar stacked device architecture. This may include devices that are NMOS on NMOS or PMOS on PMOS with the possibility of both NMOS on NMOS and PMOS on PMOS regions existing on a same die or assembly. This integration can provide for advantageous strain engineering. During localized oxidation, the proximity Si might be strained due to different lattice constant or thermal expansion between oxide and Si. The integration may also be used for electrical isolation between the top/bottom source/drain/gate regions of two unipolar devices, for example to form a series or parallel connected transistor circuit. These devices shown in FIGS. 5A-5D may be gated from either atop, beneath, or both.

Figure 5A:
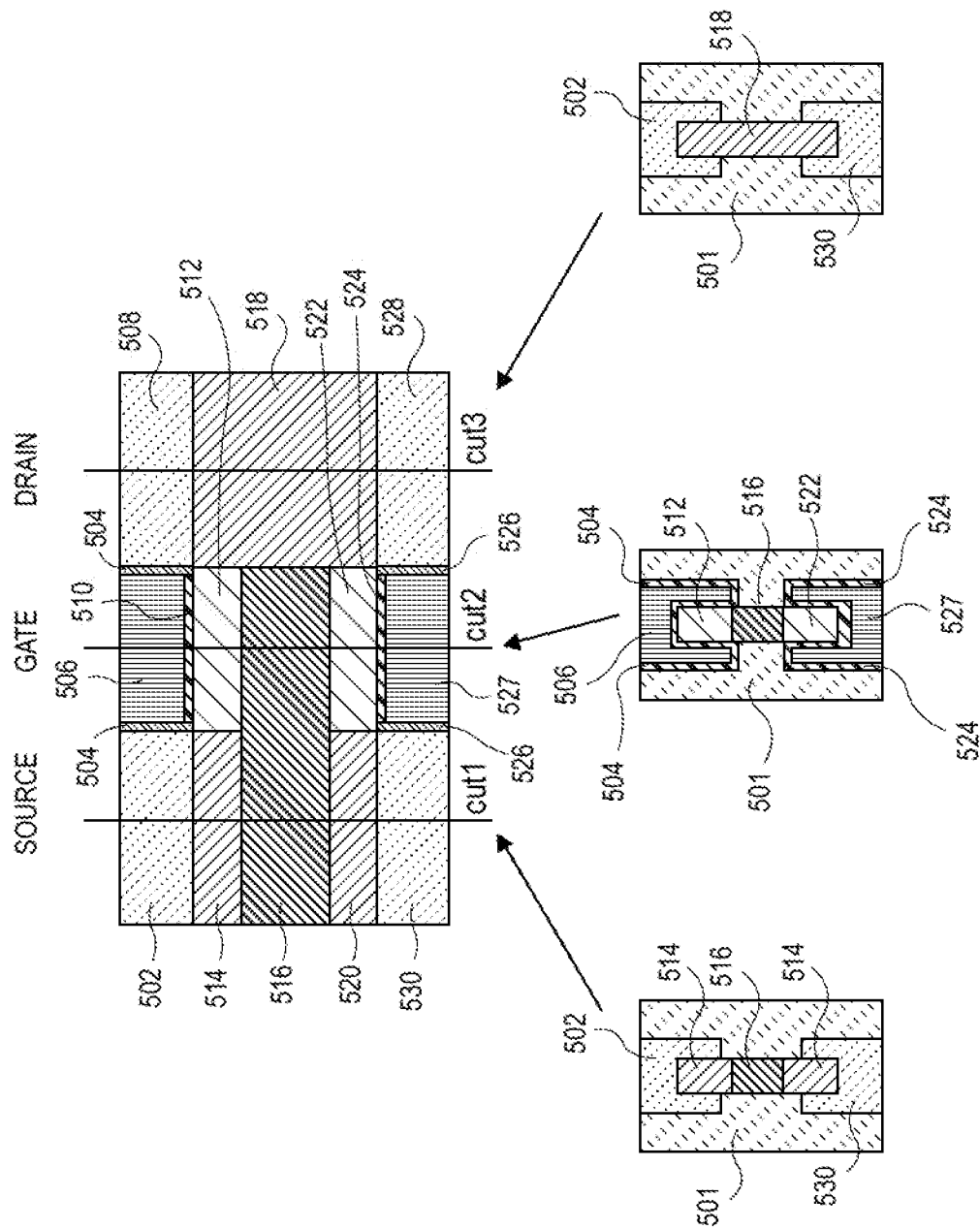
FIGS. 5A-5D illustrate examples and cross-sections of a device assembly using embodiments described herein to insert oxide layers and partial oxide layers within devices, in accordance with embodiments.

FIG. 5A shows a series connected transistor device that has ILD layers 502, 508, 528, 530 separated by gates 506, 527 that may be inside gate spacers 504, 526 respectively. The gates 506, 527 may be coupled with a gate dielectric 510, 524 that may be a high-k dielectric transition layer. The device may include metal layers 514, 518, 520 that may be Si:P (NMOS) or SiGe:B (PMOS) layers. Silicon layers 512, 522 may be coupled with the gate dielectrics 510, 524. An oxide layer 516, which may be formed using the techniques described herein for creating a localized oxide, may extend through the source side of the device through the gate, and separating the first gate 506 and first silicon 512 from the second gate 527 and the second silicon 522. The resulting device is a series connected pair of transistors that are unipolar, and may function as one half of an AND or a NAND gate, depending whether Si:P or SiGe:B metal is used. The three cut views show a side view at each of the indicated positions, with an insulating dielectric 501 that may surround the device.

Figure 5B:
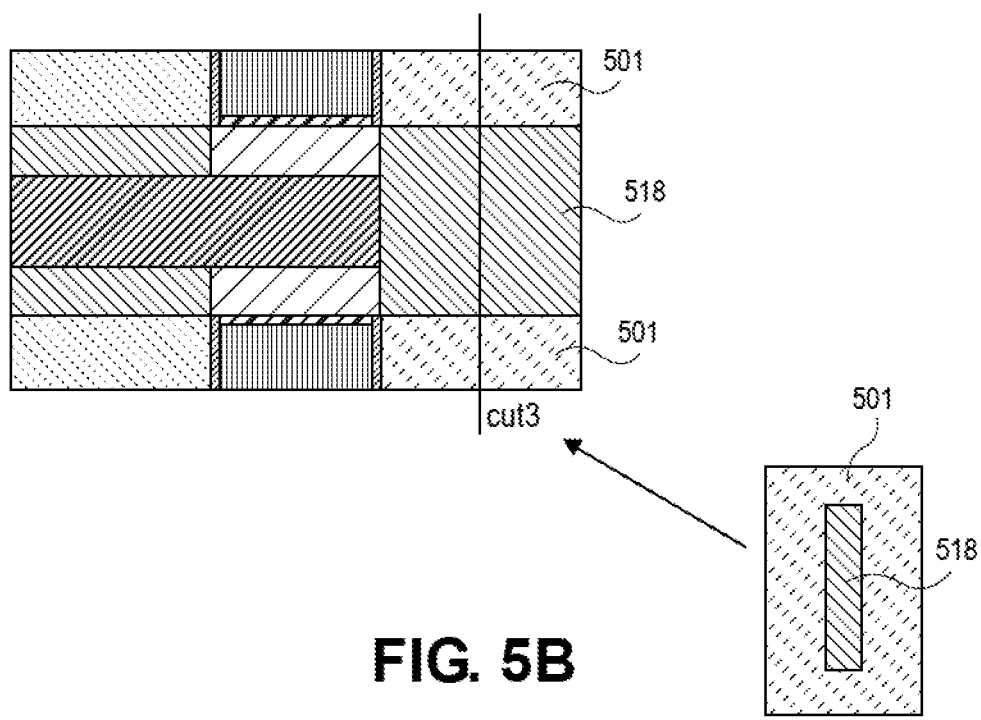

FIG. 5B shows an embodiment of an optional configuration for the device shown in FIG. 5A. Here, the ILDs 508, 528 are replaced with an insulating dielectric 501, because these contacts are not needed for the intermediate node. In embodiments related to both FIGS. 5A and 5B, the electrical routing within the device will flow from ILD 502 to silicon layer 512 to metal layer 518, back to silicon layer 522, and then finally to ILD 530.

Figure 5C:
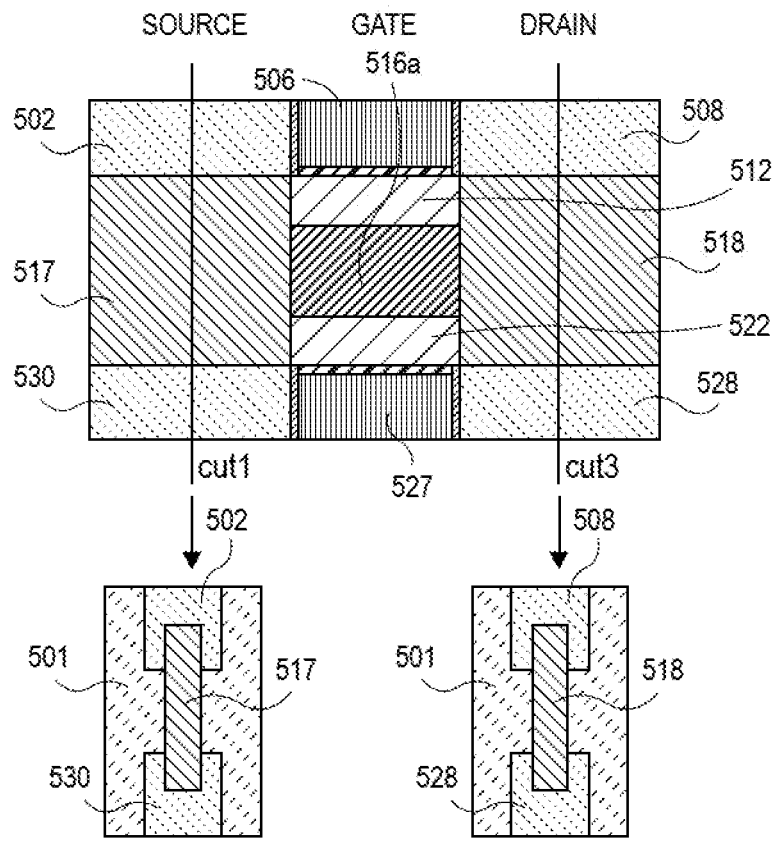
Figure 5D:
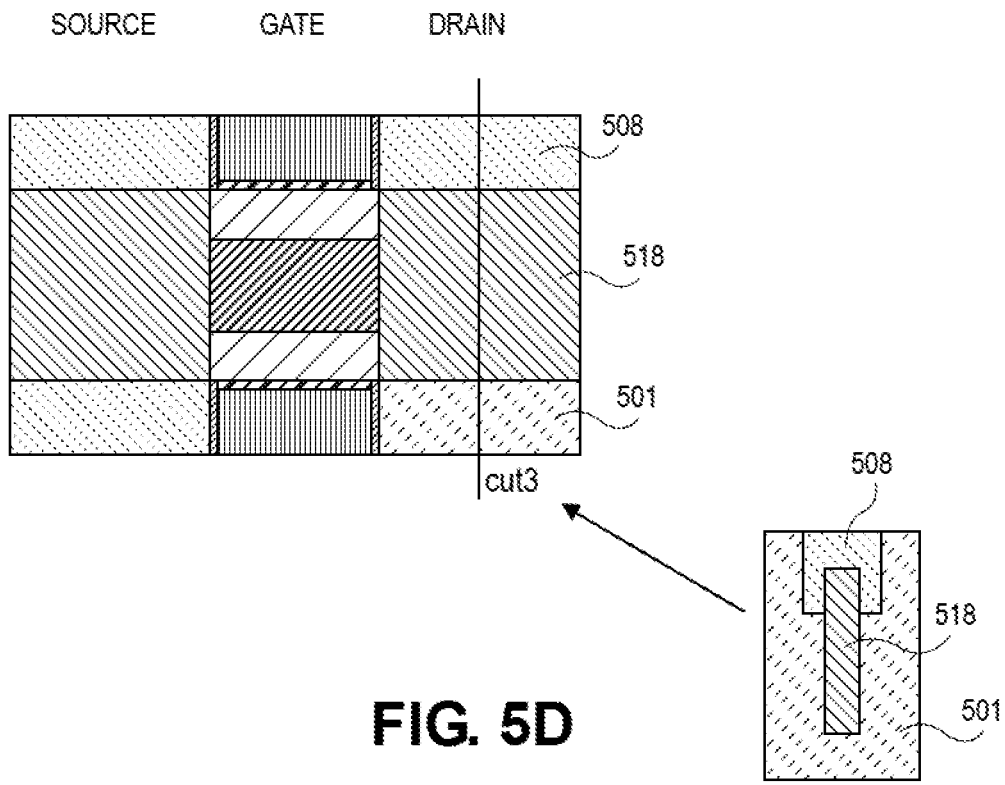

FIG. 5C may be similar to the device and FIG. 5A, however FIG. 5C shows a parallel connected transistor device with metal layers 517, 518 that may be Si:P (NMOS) or SiGe:B (PMOS) layers. The device of FIG. 5C may be used to implement an OR or a NOR gate depending upon whether NMOS or PMOS layers are used in the metal layers 517, 518. Both sources are tied together and both drains are tied together, with a oxide layer 516a separating the top portion of the fin that includes the gate 506 and silicon layer 512, from the top bottom portion of the fin that includes the gate 527 and silicon layer 522. Thus, an electrical connection may be traced through the top channel controlled by gate 506 or can be traced through the bottom channel controlled by gate 527. For PMOS, the drain metal 518 will be brought to similar electrical potential as the source metal 517 if either gate 506 or 527 is active or they are both active and the device will be considered to be in an "ON" state. Similarly for a PMOS device, if both gates 527 and 506 are inactive the device will be considered to be in an "OFF" state and the electrical potential at the source side metal 517 will be largely independent of the electrical potential at the drain side metal FIG. 5D shows an optional configuration for the device embodiment of FIG. 5C, where there is a sole ILD 508 on the drain side and an insulating dielectric 501 in place of the second ILD 528.

The example of the embodiments shown in FIGS. 5A-5D highlight the use of local oxidation techniques to perform local separation of the fin. In addition, these embodiments may also rely on incorporation with a bottom side interconnect.

Figure 6:
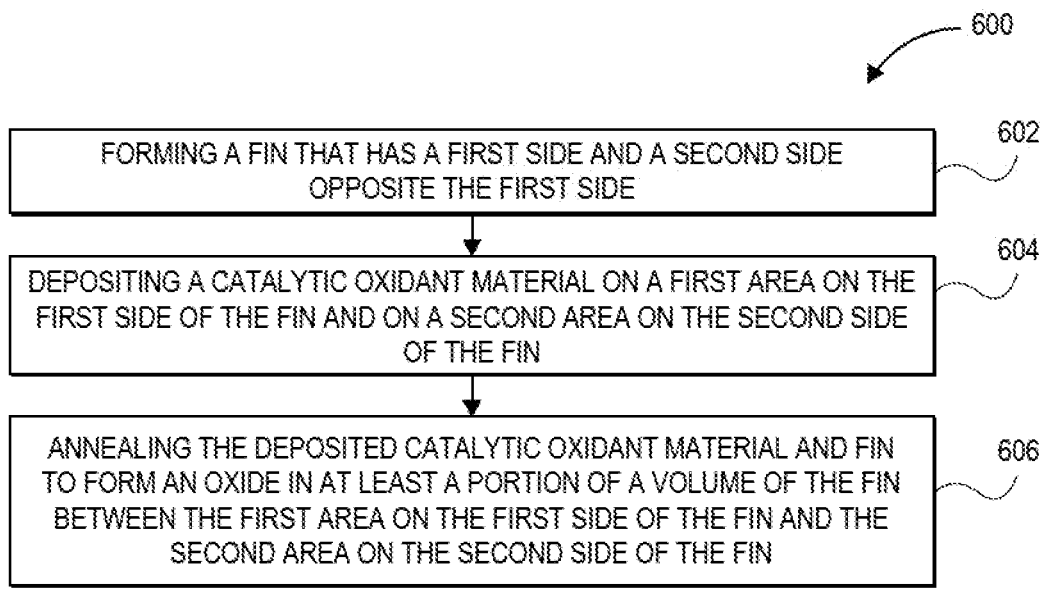
FIG. 6 illustrates an example of a process using a catalytic oxide technique to insert an oxide within a fin to separate a top channel from a bottom channel in the fin, in accordance with embodiments.

FIG. 6 illustrates an example of a process using a catalytic oxide technique to insert an oxide within a fin to separate a top channel from a bottom channel in the fin, in accordance with embodiments. Process 600 may be performed by one or more elements, techniques, apparatus, or systems that may be found with respect to FIGS. 2A-2L.

At block 602, the process may include forming a fin that has a first side and a second side opposite the first side. In embodiments, the fin may be similar to fin 204 of FIG. 2A. The fin may be made of Si, SiGe, or Ge, and may be positioned orthogonally to a substrate. In embodiments, the fins may be in the shape of a pillar or an elongated pillar.

At block 604, the process may include depositing a catalytic oxidant material on a first area on the first side of the fin and on a second area on the second side of the fin. In embodiments, the catalytic oxidant material may be similar to catalytic oxidant material 208 of FIG. 2C that is applied to areas on both sides of the exposed fin 206. In embodiments, the catalytic oxidation material may be alumina-based.

At block 606, the process may include annealing the deposited catalytic oxidant material and fin to form an oxide in at least a portion of a volume of the fin between the first area on the first side of the fin and the second area on the second side of the fin. In embodiments, the result of an annealing process forms an oxide similar to oxide 218 of FIG. 2I1 within the fin 204.

Figure 7:
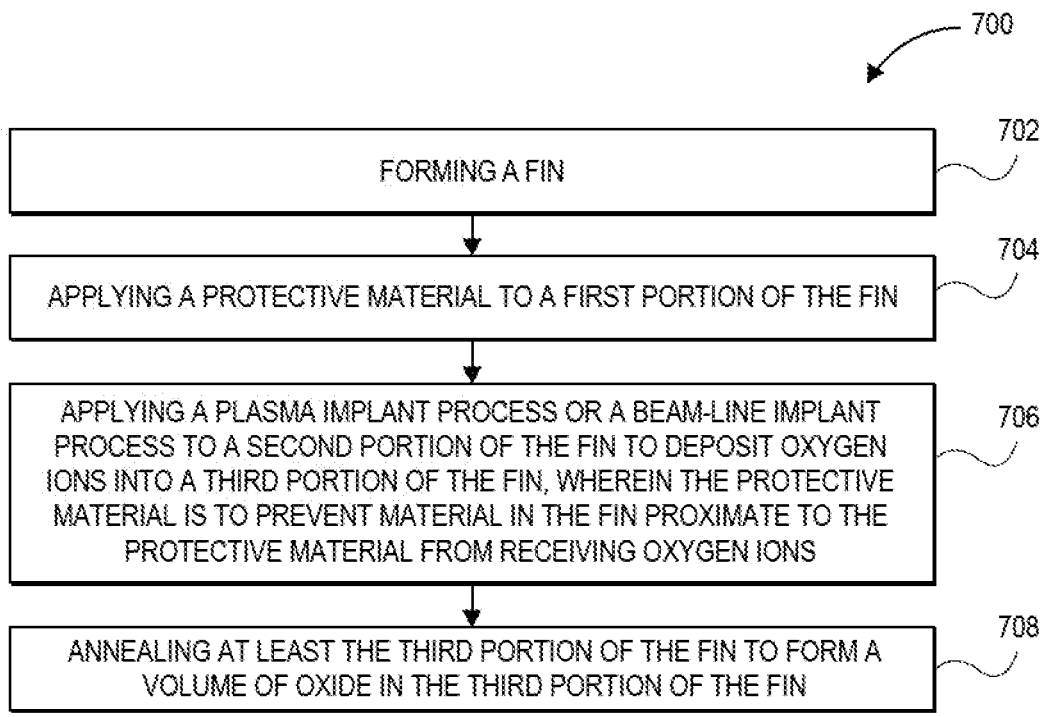
FIG. 7 illustrates an example of a process using an oxygen implant technique to insert an oxide within a fin to separate a top channel from a bottom channel in the fin, in accordance with embodiments.

FIG. 7 illustrates an example of a process using an oxygen implant technique to insert an oxide within a fin to separate a top channel from a bottom channel in the fin, in accordance with embodiments. Process 700 may be performed by one or more elements, techniques, apparatus, or systems that may be found with respect to FIGS. 3A-3D.

At block 702, the process may include forming a fin. In embodiments, the fin may be similar to fin 304 of FIG. 3A. The fin may be made of Si, SiGe, or Ge, and may be positioned orthogonally to a substrate.

At block 704, the process may include applying a protective material to a first portion of the fin. In embodiments, the protective material may be helmet 307 of FIG. 3A that covers a portion of the fin 304. In embodiments, the protective material may include a trench material 302, or some other material that can be placed proximate to portions of the fin 304 to prevent oxygen ions from entering into a portion of the fin 304.

At block 706, the process may include applying a plasma implant process or a beam-line implant process to a second portion of the fin to deposit oxygen ions into a third portion of the fin, wherein the protective material is to prevent material in the fin proximate to the protective material from receiving oxygen ions. In embodiments, the beam-line implant process may be similar to the process as shown in FIG. 3B, where oxygen ions 312 are accelerated and shot into a portion of the fin 304. In embodiments, the plasma implant process may be similar to the process as shown in FIG. 3C, where plasma 313 that contains oxygen species that may be a pulsed or be a DC-biased plasma, where oxygen is then pulled into the exposed fin 304 by an electrostatic force.

At block 708, the process may include annealing at least the third portion of the fin to form a volume of oxide in the third portion of the fin. The result of the annealing process may be similar to oxide 318 of FIG. 3B, 319 of FIG. 3C, or FIG. 3D, where oxygenated portions of the fin 304 are converted to an oxide.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 8:
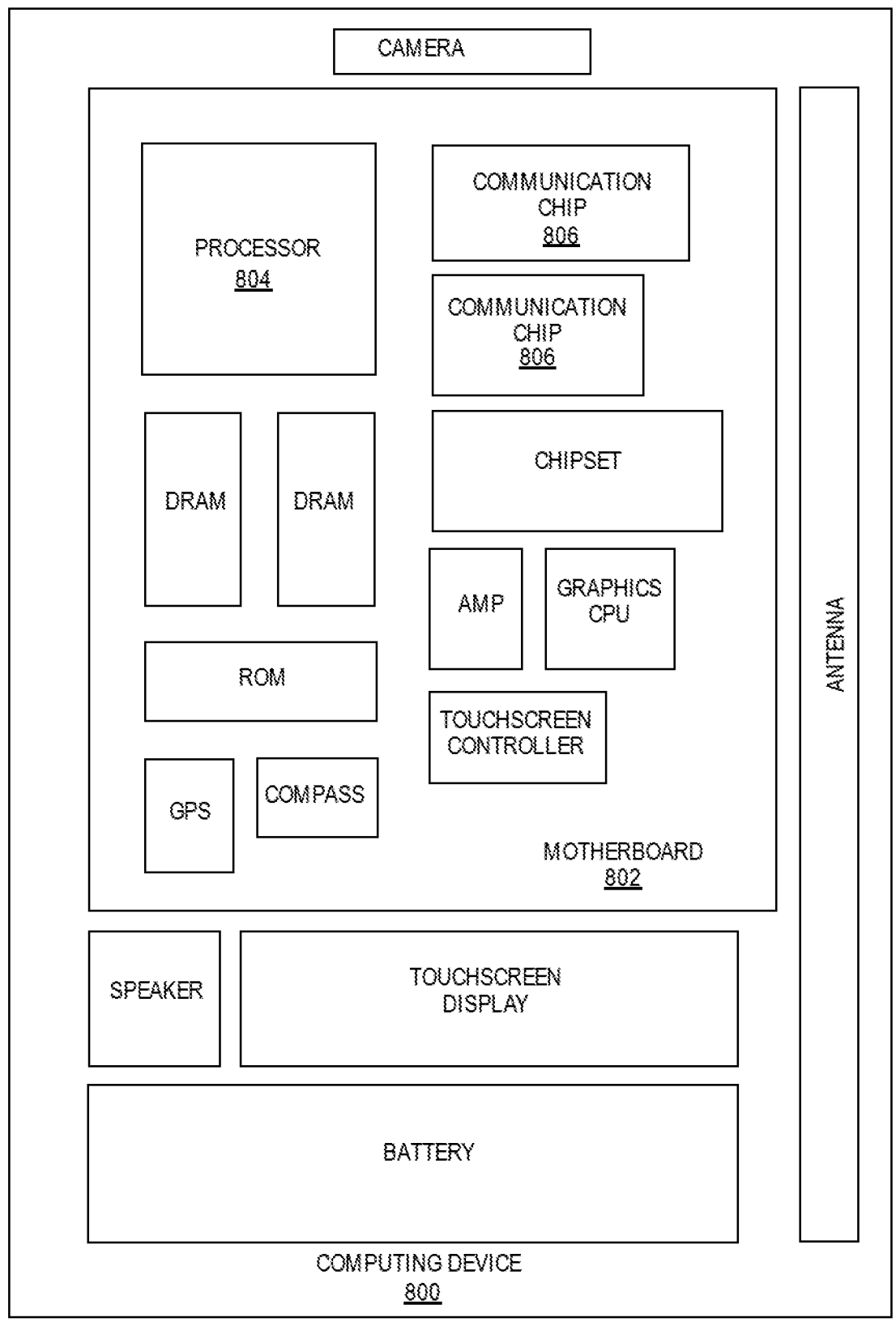
FIG. 8 illustrates a computing device 800 in accordance with one implementation of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more devices, such as MOS-FET transistors built in accordance with implementations of the invention.

In further implementations, another component housed within the computing device 800 may contain an integrated circuit die that includes one or more devices, such as MOS-FET transistors built in accordance with implementations of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
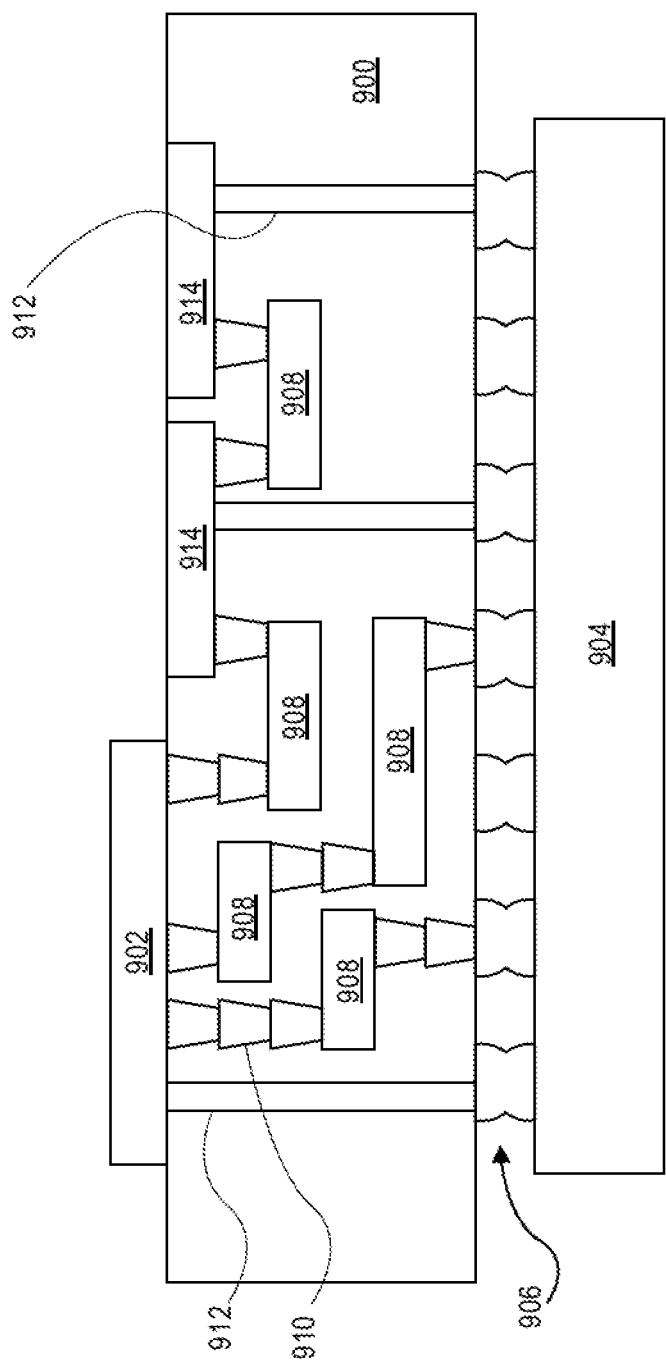
FIG. 9 illustrates an interposer 900 that includes one or more embodiments of the invention.

FIG. 9. illustrates an interposer 900 that includes one or more embodiments of the invention. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer 900 may be formed of alternate rigid or flexible materials that may include the same materials described above for use in a semiconductor substrate, such as silicon, germanium, and other group III-V and group IV materials.

The interposer 900 may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the invention, apparatuses or processes disclosed herein may be used in the fabrication of interposer 900.

EXAMPLES

The following paragraphs describe examples of various embodiments.

Example 1 is an apparatus comprising: a fin with a first side and a second side opposite the first side that are substantially parallel to a plane of the fin; a volume of oxide that extends through the fin from a first area on the first side of the fin to a second area on the second side of the fin; and wherein the oxide is formed based at least in part on fin material previously present in the volume.

Example 2 includes the apparatus of example 1, wherein the first area on the first side of the fin and the second area on the second side of the fin substantially overlap in a Z-direction perpendicular to the plane of the fin.

Example 3 includes the apparatus of example 1, wherein the fin is coupled with and perpendicular to a substrate.

Example 4 includes the apparatus of example 1, wherein the fin material is a selected one of silicon (Si), germanium (Ge) or silicon-germanium (SiGe).

Example 5 includes the apparatus of any one of examples 1-4, further including a first volume of the fin coupled with a first side of the volume of oxide, and a second volume of the fin coupled with a second side of the volume of oxide opposite the first side.

Example 6 includes the apparatus of example 5, wherein a surface of the volume of oxide includes a catalytic oxide.

Example 7 includes the apparatus of example 5, wherein the first side of the volume of oxide has a bowl shape that extends towards the second side of the volume of oxide.

Example 8 includes the apparatus of example 7, wherein the second side of the volume of oxide has a bowl shape that extends toward the first side of the volume of oxide.

Example 9 includes the apparatus of example 7, wherein the first side of the volume of oxide or the second side of the volume of oxide is an elliptic hyperboloid.

Example 10 includes the apparatus of example 5, wherein the first side of the volume of oxide has a generally conic shape that extends toward the second side of the volume of oxide.

Example 11 includes the apparatus of example 10, wherein the second side of the volume of oxide has a generally conic shape that extends away from the first side of the volume of oxide.

Example 12 includes the apparatus of example 5, wherein the first volume of the fin or the second volume of the fin includes residuals that include oxygen or fluorine species.

Example 13 is a method comprising: forming a fin that has a first side and a second side opposite the first side; depositing a catalytic oxidant material on a first area on the first side of the fin and on a second area on the second side of the fin; and annealing the deposited catalytic oxidant material and a portion of the fin to form an oxide in at least a portion of a volume of the fin between the first area on the first side of the fin and the second area on the second side of the fin.

Example 14 includes the method of example 13, wherein the fin includes a selected one of Si, Ge or SiGe.

Example 15 includes the method of example 13, wherein forming a fin further includes: forming a fin within a shallow trench isolation (STI) substrate.

Example 16 includes the method of example 15, wherein the fin is substantially perpendicular to a plane of the STI substrate.

Example 17 includes the method of any one of examples 13-15, wherein depositing a catalytic oxidant material on a first area on the first side of the fin and on a second area on the second side of the fin further includes: recessing at least a part of the STI substrate to expose a portion of the fin; depositing the catalytic oxidant material on the exposed portion of the fin; and etching the catalytic oxidant material from at least a portion of the exposed fin.

Example 18 is a method comprising: forming a fin; applying a protective material to a first portion of the fin; applying a plasma implant process or a beam-line implant process to a second portion of the fin to deposit oxygen ions into a third portion of the fin, wherein the protective material is to prevent material in the fin proximate to the protective material from receiving oxygen ions; and annealing at least the third portion of the fin to form a volume of oxide in the third portion of the fin.

Example 19 includes the method of example 18, wherein the fin includes a selected one of Si, Ge or SiGe.

Example 20 includes the method of any one of examples 18-19, wherein forming a fin further includes: forming a fin within a shallow trench isolation (STI) substrate.

Example 21 includes the method of example 20, wherein the fin is substantially perpendicular to a plane of the STI substrate, or wherein the second portion of the fin and the third portion of the fin are a same portion.

Example 22 includes a device comprising: a substrate; a transistor coupled with the substrate, the transistor comprising: a fin coupled with and substantially perpendicular to a plane of the substrate, wherein the fin includes: a first side and a second side opposite the first side that are substantially parallel to a plane of the fin; a volume of oxide that extends through the fin from a first area on the first side of the fin to a second area on the second side of the fin; and wherein the oxide is formed based at least in part on fin material previously present in the one or more volumes.

Example 23 includes device of example 22, wherein a fin material is a selected one of Si, Ge, or SiGe.

Example 24 includes the device of example 22, wherein a first volume of material of the fin is coupled with a first side of the volume of oxide and a second volume of material of the fin is coupled with a second side of the volume oxide opposite the first side of the volume of oxide, and wherein the first volume of material is a N or P layer, the volume of oxide is a separation layer, and the second volume of material is a N or P layer.

Example 25 includes the device of any one of examples 22-24, wherein the first volume of the material or the second volume of the material includes residuals that include oxygen or fluorine species.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. An apparatus comprising:
   a fin with a first side and a second side opposite the first side, wherein the first side and the second side are substantially parallel to a plane of the fin;
   a volume of oxide that extends through the fin from a first area on the first side of the fin to a second area on the second side of the fin;
   wherein the volume of oxide has an upper portion and a lower portion, wherein the upper portion comprises a first surface, wherein a first point on the first surface at the first side of the fin or at the second side of the fin is above a second point on the first surface between the first side of the fin and the second side of the fin; and
   wherein the lower portion of the volume of oxide comprises a second surface, and wherein a third point on the second surface at the first side of the fin or at the second side of the fin is above a fourth point on the second surface between the first side of the fin and the second side of the fin.

2. The apparatus of claim 1, wherein the fin includes a selected one of: silicon (Si), germanium (Ge), or silicon-germanium (SiGe).

3. The apparatus of claim 1, wherein the first surface or the second surface has a shape that is a selected one or more of: a bowl shape or a conic shape.

4. The apparatus of claim 1, wherein a first portion of the fin above the volume of oxide or a second portion of the fin below the volume of oxide includes a selected one or more of: oxygen atoms or fluorine atoms.

5. A device comprising:
   a substrate; and
   a transistor coupled with the substrate, the transistor comprising:
   a fin coupled with and substantially perpendicular to a plane of the substrate, wherein the fin includes:
   a first side and a second side opposite the first side that are substantially parallel to a plane of the fin;
   a volume of oxide that extends through the fin from a first area on the first side of the fin to a second area on the second side of the fin;
   wherein the volume of oxide has an upper portion and a lower portion, wherein the upper portion comprises a first surface, wherein a first point on the first surface at the first side of the fin or at the second side of the fin is above a second point on the first surface between the first side of the fin and the second side of the fin; and
   wherein the lower portion of the volume of oxide comprises a second surface, and wherein a third point on the second surface at the first side of the fin or at the second side of the fin is above a fourth point on the second surface between the first side of the fin and the second side of the fin.

6. The device of claim 5, wherein the fin includes a selected one or more of: Si, Ge, or SiGe.

7. The device of claim 5, wherein a first volume of the fin is coupled with the first surface and a second volume of the fin is coupled with the second surface, and wherein the first volume of the fin is a N or P layer, the volume of oxide is a separation layer, and the second volume of the fin is a N or P layer.

8. The device of claim 7, wherein the first volume of the fin or the second volume of the fin includes a selected one or more of: oxygen atoms or fluorine atoms.

\* \* \* \* \*